(12) United States Patent
Christiansen et al.

(10) Patent No.: US 9,214,427 B2
(45) Date of Patent: Dec. 15, 2015

(54) METHOD OF SELF-CORRECTING POWER GRID FOR SEMICONDUCTOR STRUCTURES

(71) Applicant: International Business Machines Corporation, Armonk, NY (US)

(72) Inventors: Cathryn J. Christiansen, Huntington, VT (US); Andrew H. Norfleet, Burlington, VT (US); Kirk D. Peterson, Jericho, VT (US); Andrew A. Turner, Milton, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/710,935

(22) Filed: May 13, 2015

(65) Prior Publication Data

US 2015/0243601 A1    Aug. 27, 2015

Related U.S. Application Data

(62) Division of application No. 14/065,777, filed on Oct. 29, 2013, now Pat. No. 9,087,841.

(51) Int. Cl.
*H01L 21/44* (2006.01)
*H01L 23/525* (2006.01)
*H01L 23/535* (2006.01)

(52) U.S. Cl.
CPC .......... *H01L 23/5256* (2013.01); *H01L 23/535* (2013.01)

(58) Field of Classification Search
CPC ............................ H01L 23/525; H01L 21/768
USPC .......................................... 257/529; 438/601
See application file for complete search history.

(56) References Cited

U.S. PATENT DOCUMENTS

| 4,866,507 | A | * | 9/1989 | Jacobs et al. | 174/258 |
| 5,128,737 | A | * | 7/1992 | van der Have | 257/503 |
| 5,171,713 | A | * | 12/1992 | Matthews | 438/31 |
| 5,315,130 | A |   | 5/1994 | Hively et al. | |
| 5,790,839 | A |   | 8/1998 | Luk et al. | |
| 5,936,296 | A | * | 8/1999 | Park et al. | 257/529 |
| 5,976,898 | A | * | 11/1999 | Marty et al. | 438/12 |

(Continued)

OTHER PUBLICATIONS

Henry, Notice of Allowance and Fee(s) Due for U.S. Appl. No. 14/065,777 dated Mar. 23, 2015, 7 pages.

(Continued)

*Primary Examiner* — Caleb Henry
(74) *Attorney, Agent, or Firm* — David Cain; Hoffman Warnick LLC

(57) ABSTRACT

Aspects of the present invention relate to a self-correcting power grid for a semiconductor structure and a method of using thereof. Various embodiments include a self-correcting power grid for a semiconductor structure. The power grid may include a plurality of interconnect layers. Each of the plurality of interconnect layers may include a plurality of metal lines, where each of the plurality of metal lines are positioned substantially parallel to one another and substantially perpendicular to a plurality of distinct metal lines in adjacent interconnect layers. Additionally the interconnect layers may include a plurality of fuses formed within each of the metal lines of the plurality of interconnect layers. In the power grid, at least one of the fuses positioned immediately adjacent to a defect included in the power grid may be configured to blow during a testing process to isolate the defect.

17 Claims, 4 Drawing Sheets

(56) References Cited

U.S. PATENT DOCUMENTS

| | | | |
|---|---|---|---|
| 6,222,212 B1* | 4/2001 | Lee et al. | 257/207 |
| 7,602,040 B2* | 10/2009 | Hotta et al. | 257/529 |
| 7,709,928 B2 | 5/2010 | Kim et al. | |
| 7,956,466 B2* | 6/2011 | Hsu et al. | 257/758 |
| 8,183,665 B2* | 5/2012 | Bertin et al. | 257/529 |
| 8,188,516 B2 | 5/2012 | Correale, Jr. et al. | |
| 8,331,185 B2 | 12/2012 | Obayashi et al. | |
| 8,804,398 B2* | 8/2014 | Chung | 365/148 |
| 2001/0045655 A1* | 11/2001 | Matsubara | 257/758 |
| 2002/0038903 A1* | 4/2002 | Tsau | 257/532 |
| 2006/0223242 A1* | 10/2006 | Daubenspeck et al. | 438/132 |
| 2007/0026664 A1* | 2/2007 | Hotta et al. | 438/622 |
| 2007/0262357 A1* | 11/2007 | Ueda | 257/249 |
| 2008/0099877 A1* | 5/2008 | Daubenspeck et al. | 257/529 |
| 2008/0179706 A1* | 7/2008 | Kim et al. | 257/529 |
| 2008/0296728 A1* | 12/2008 | Yang et al. | 257/530 |
| 2009/0045484 A1* | 2/2009 | Chanda et al. | 257/529 |
| 2009/0146250 A1* | 6/2009 | Ono | 257/529 |
| 2009/0174075 A1* | 7/2009 | Yang et al. | 257/751 |
| 2009/0204835 A1 | 8/2009 | Smith et al. | |
| 2009/0256235 A1* | 10/2009 | Takaoka et al. | 257/529 |
| 2009/0278228 A1* | 11/2009 | Hsu et al. | 257/529 |
| 2009/0278229 A1* | 11/2009 | Yang et al. | 257/529 |
| 2010/0032797 A1* | 2/2010 | Takewaki | 257/529 |
| 2010/0096724 A1* | 4/2010 | Kubota et al. | 257/529 |
| 2010/0133650 A1* | 6/2010 | Kubota et al. | 257/529 |
| 2010/0164111 A1* | 7/2010 | Yang et al. | 257/758 |
| 2010/0176483 A1* | 7/2010 | Iguchi | 257/529 |
| 2011/0156858 A1* | 6/2011 | Poppe et al. | 337/414 |
| 2011/0246959 A1 | 10/2011 | Tang et al. | |
| 2012/0074367 A1* | 3/2012 | Costa et al. | 257/2 |
| 2012/0223802 A1 | 9/2012 | Shin et al. | |
| 2012/0326269 A1* | 12/2012 | Bonilla et al. | 257/529 |
| 2012/0326310 A1* | 12/2012 | Busnaina et al. | 257/746 |
| 2013/0127584 A1* | 5/2013 | Filippi et al. | 337/297 |
| 2013/0214894 A1* | 8/2013 | Bonilla et al. | 337/290 |
| 2013/0307114 A1* | 11/2013 | Poppe et al. | 257/529 |
| 2014/0021578 A1* | 1/2014 | Bao et al. | 257/529 |
| 2014/0319650 A1* | 10/2014 | Coyner et al. | 257/529 |
| 2014/0332923 A1* | 11/2014 | Filippi et al. | 257/529 |
| 2014/0332924 A1* | 11/2014 | Bao et al. | 257/529 |
| 2014/0346674 A1* | 11/2014 | Bao et al. | 257/741 |

OTHER PUBLICATIONS

Henry, Office Action Communication for U.S. Appl. No. 14/065,777 dated Dec. 31, 2014, 13 pages.

* cited by examiner


METHOD OF SELF-CORRECTING POWER GRID FOR SEMICONDUCTOR STRUCTURES

BACKGROUND

1. Technical Field

The disclosure is related generally to semiconductor structures. More particularly, the disclosure is related to a self-correcting power grid for semiconductor structures and a method of using a self-correcting power grid.

2. Related Art

Various components and devices in conventional semiconductor structures require electrical power for operation. For example, transistors of a chip formed by conventional semiconductor structures may require power in order for the chip to operate as desired. The electrical power supplied to the transistors and other components of the chip are typically provided by a plurality of electrical interconnects conventionally known as "power grids." The power grids of the semiconductor structure are manufactured through a process commonly known as a back-end-of-line (BEOL) process, and may be manufactured to include various layers of interconnects, where the interconnects in each layer are positioned perpendicular to the preceding and following layer. That is, the various layers of interconnects may span across a plurality of conductive levels in the semiconductor structure and may supply electrical power to various components and devices in the semiconductor structure.

In manufacturing conventional semiconductor structures, it may be common that the semiconductor structure, and specifically the power grid, may include defects. That is, during the manufacturing of conventional semiconductor structures, defects may be formed within the power grid as a consequence of an undesirable variable that may occur during the manufacturing process. Conventional defects may include an opening or void in a portion of the various layers of interconnects forming the power grid. During subsequent manufacturing processes of the semiconductor structure, these voids may be filed with a metal. This defect filled with metal in the power grid may cause a small short in the power grid, however, under conventional testing procedures for the semiconductor, the short caused by the defect may go undetected. Additionally, as a result of the redundancy of the power grid, the semiconductor structure including the defect may ultimately operate as desired in its early operational life. However, as the operational life of the semiconductor structure including the defect in the power grid increases, the reliability (e.g., operational life-span) of the semiconductor structure substantially decreases. More specifically, over time, the undetected defect in the power grid may cause the semiconductor structure to prematurely fail. For example, the undetected defect in the power grid may cause excess heat generation around the device (e.g., transistor) to which it is supplying electrical power, which may increase electro-migration, ultimately resulting in failure of the device. Additionally, because the defect may be undetected during conventional testing procedures, the failure of the semiconductor structure caused by the defect may be substantially difficult to anticipate and/or detect during the operational life of the semiconductor structure.

BRIEF SUMMARY

A self-correcting power grid for a semiconductor structure and a method of using a self-correcting power grid thereof are discussed. Various embodiments include a self-correcting power grid for a semiconductor structure. The power grid may include: a plurality of interconnect layers, each of the plurality of interconnect layers including: a plurality of metal lines, each of the plurality of metal lines positioned substantially parallel to one another and positioned substantially perpendicular to a plurality of distinct metal lines in an adjacent interconnect layer; and a plurality of fuses formed within each of the plurality of metal lines of each of the plurality of interconnect layers, wherein at least one of the plurality of fuses positioned immediately adjacent to a defect included in at least one of the plurality of interconnect layers is configured to blow during a testing process to isolate the defect.

A first aspect of the invention includes a self-correcting power grid for a semiconductor structure. The power grid may include: a plurality of interconnect layers, each of the plurality of interconnect layers including: a plurality of metal lines, each of the plurality of metal lines positioned substantially parallel to one another and positioned substantially perpendicular to a plurality of distinct metal lines in an adjacent interconnect layer; and a plurality of fuses formed within each of the plurality of metal lines of each of the plurality of interconnect layers, wherein at least one of the plurality of fuses positioned immediately adjacent to a defect included in at least one of the plurality of interconnect layers is configured to blow during a testing process to isolate the defect.

A second aspect of the invention includes a method of self-correcting a power grid of a semiconductor structure. The method includes: providing the power grid of the semiconductor structure, the power grid including: a plurality of interconnect layers, each of the plurality of interconnect layers including: a plurality of metal lines, each of the plurality of metal lines positioned substantially parallel to one another and positioned substantially perpendicular to a plurality of distinct metal lines in an adjacent interconnect layer, and a plurality of fuses formed within each of the plurality of metal lines of each of the plurality of interconnect layers; and isolating a defect included in the power grid of the semiconductor structure by performing a testing process on the semiconductor structure including the power grid, the testing process blowing at least one of the plurality of fuses positioned immediately adjacent to the defect.

BRIEF DESCRIPTION OF THE DRAWINGS

These and other features of this invention will be more readily understood from the following detailed description of the various aspects of the invention taken in conjunction with the accompanying drawings that depict various embodiments of the invention in which.

Figure 1:
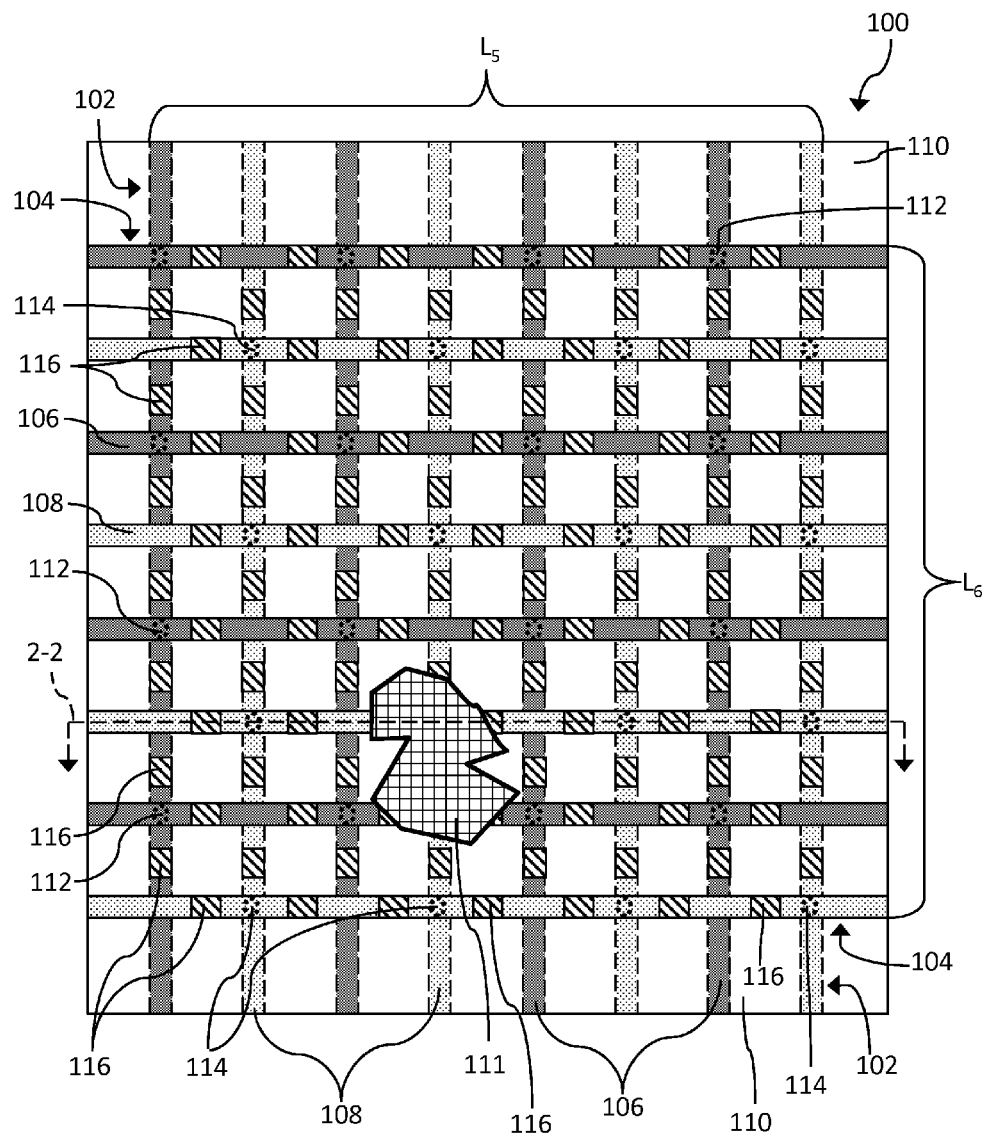
FIG. 1 shows a plane view of a portion of a self-correcting power grid for a semiconductor structure undergoing processes according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to semiconductor structures. More particularly, as described herein, aspects of the invention are related to a self-correcting power grid for semiconductor structures and a method of self-correcting a power grid of a semiconductor structure. The self-correcting power grid and the method of self-correcting may now be described. That is, turning to FIGS. 1-4, the self-correcting power grid and method of self-correcting according to various embodiments is shown.

Figure 2:
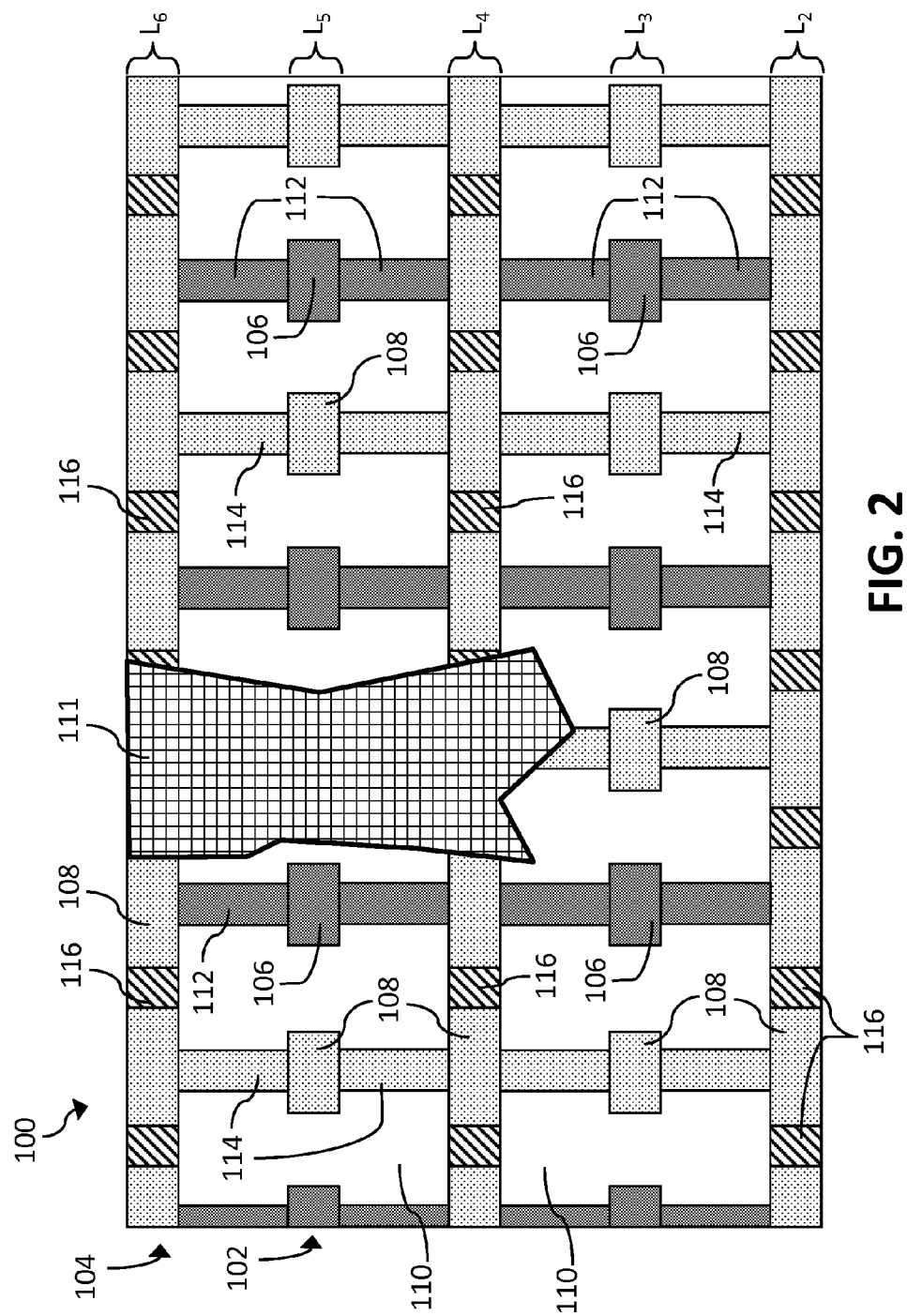
FIG. 2 shows a cross-sectional front view through reference line 2-2 of a portion of a self-correcting power grid for a semiconductor structure as shown in FIG. 1, undergoing processes according to various embodiments of the invention.

FIGS. 1 and 2 depict a process according to various embodiments of the invention, the process including providing a self-correcting power grid 100 (hereafter, "power grid 100") of the semiconductor structure (not shown). That is, FIG. 1 shows a plane view of a portion of power grid 100 for a semiconductor structure according to embodiments. Power grid 100 may include a plurality of interconnect layer $L_{1-n}$ forming power grid 100. Fifth interconnect layer $L_5$ and sixth interconnect layer $L_6$ of power grid 100 are shown in FIG. 1. More specifically, as shown in FIG. 1, power grid 100 may include fifth interconnect layer $L_5$, and sixth interconnect layer $L_6$ positioned substantially above and/or adjacent to fifth interconnect layer $L_5$. It is understood that power grid 100 may be formed for a plurality of interconnect layers $L_{1-n}$ stacked upon one another, where each of the plurality of interconnect layers $L_{1-n}$ may cover a plurality of conductive levels in the semiconductor structure (not shown). The plurality of interconnect layers $L_{1-n}$ may be electrically connected to a device (e.g., transistor) of the semiconductor structure (not shown) and may be configured to supply the device with electrical power, as is understood in the art.

As shown in FIG. 1, each of the plurality of interconnect layers $L_{1-n}$ may include a plurality of metal lines 102, 104. Each of the plurality of metal lines 102, 104 may be positioned substantially parallel to one another and may be positioned substantially perpendicular to a plurality of distinct metal lines in an adjacent interconnect layer $L_{1-n}$. For example, as shown in FIG. 1, each of the plurality of metal lines 102, shown in phantom, forming fifth interconnect layer $L_5$ may be positioned substantially parallel to one another. Additionally, each of the plurality of metal lines 102, shown in phantom, forming fifth interconnect layer $L_5$ may be positioned substantially perpendicular to each of the plurality of lines 104 forming sixth interconnect layer $L_6$. Further, as shown in FIG. 1, each of the plurality of lines 104 forming sixth interconnect layer $L_6$ may be positioned substantially parallel to one another. It is understood that the alternating positioned of the plurality of metal lines (e.g., metal lines 102, 104) discussed herein with respect to fifth interconnect layer L5 and sixth interconnect layer $L_6$ may also continue through the plurality of interconnect layers $L_{1-n}$ forming power grid 100.

The plurality of metal lines 102, 104 forming the plurality of interconnect layers $L_{1-n}$ may further include a plurality of voltage lines 106 and a plurality of ground lines 108. More specifically, as shown in FIG. 1, the plurality of metal lines 102, 104 may include the plurality of voltage lines 106 and the plurality of ground lines 108, wherein the plurality of voltage lines 106 and the plurality of ground lines 108 may be positioned in an alternating pattern and may be positioned substantially parallel to one another. For example, with respect to sixth interconnect layer $L_6$, the metal lines 104 include the plurality of voltage lines 106 and the plurality of ground lines 108, where a single voltage line 106 may be positioned between two ground lines 108, and may be positioned substantially parallel to the two surround ground lines 108. The plurality of voltage lines 106 and the plurality of ground lines 108 may be made from any conventional material having electric conductivity and capable of allowing an electrical current to flow through each of the plurality of metal lines 102, 104. That is, the plurality of voltage lines 106 and the plurality of ground lines 108 may be made of an electrically conductive material including, but not limited to: copper, aluminum, and polysilicide. Also shown in FIG. 1, the plurality of metal lines 102, 104 and specifically the plurality of voltage lines 106 and the plurality of ground lines 108, may be formed in a dielectric layer 110 of the semiconductor structure (not shown). That is, each of the plurality of interconnection layers $L_{1-n}$ including voltage lines 106 and ground lines 108 forming plurality of metal lines 102, 104 may be formed in dielectric layer 110 of semiconductor structure (not shown) including power grid 100. Dielectric layer 110 may be made of any conventional dielectric material capable of electrically insulating the plurality of metal lines 102, 104 formed in each of the plurality of interconnect layers $L_{1-n}$ of power grid 100.

Power grid 100 may also include a defect 111 included in at least one of the plurality of interconnect layers $L_{1-n}$. That is, as shown in FIGS. 1 and 2, defect 111 of power grid 110 may be positioned through a plurality of interconnect layers $L_{1-n}$ including sixth interconnect layer $L_6$, fifth interconnect layer $L_5$, and fourth interconnect layer $L_4$ (FIG. 2). As shown in FIG. 2, third interconnect layer $L_3$ and second interconnect layer $L_2$ may not be effected by defect 111, as defect 111 may only extend through a portion of the dielectric layer 110 between fourth interconnect layer $L_4$ and third interconnect layer $L_3$, and may not extend to third interconnect layer $L_3$. As shown in FIGS. 1 and 2, defect 111 may also be positioned through at least one of the plurality of metal lines 102, 104 included in the plurality of interconnect layers $L_{1-n}$. More specifically, defect 111 may be positioned through a portion of voltage line 106 of metal lines 104 of sixth interconnect layer $L_6$ and a portion of ground line 108 of metal lines 104 of sixth interconnect layer $L_6$. Additionally, defect 111 may be positioned through a portion of ground line 108 of metal lines 102, shown in phantom, of fifth interconnect layer $L_5$. Defect 111 of power grid 100 may include a metal deposit formed in power grid 100 during a manufacturing process of a semiconductor structure (not shown). That is, defect 111 may include a metal deposit which may fill an undesirable opening in power grid 100 that may be formed within dielectric layer 110 and/or metal lines 102, 104 of the plurality of interconnect layers $L_{1-n}$ during the formation or manufacturing of power grid 100. Although shown as a void filled with a metal deposit, defect 111 may include any conventional defect (e.g., metal puddle) that may negatively affect the operation of power grid 100. Defect 111 included in power grid 100 may negatively affect the semiconductor structure in a plurality of ways including, but not limited to: failure of power grid 100 to provide electrical current to at least one component (e.g., transistor) of the semiconductor structure, ultimately resulting in failure of the semiconductor structure itself; or failure in near-by non-power grid 100 lines, which may result in corruptions in the data input/output of the semiconductor structure. More specifically, defect 111 of power grid 100, over the operational life of the semiconductor structure, may cause a variety of undesirable effects on power grid 100 and/or the semiconductor structure including, but not limited to: excess voltage draw in the portions of power grid 100 including defect 111, short circuiting in the portion of the power grid 100 including defect 111, excess heat generation in power grid 100 surrounding defect 111, increased rate of electro-migration within power grid 100, etc.

As shown in FIG. 1, each of the plurality of metal lines 102, 104 forming the plurality of interconnect layers $L_{1-n}$ may also include a plurality of vias 112, 114 for electrically connecting each of the plurality of interconnect layers $L_{1-n}$. More specifically, as shown in FIGS. 1 and 2, each of the plurality of voltage lines 106 may include the plurality of vias 112 for electrically connecting the plurality of voltage lines 106 positioned in each of the plurality of interconnect layers $L_{1-n}$. Additionally, as shown in FIGS. 1 and 2, each of the plurality of ground lines 108 may include the plurality of vias 114 for electrically connecting the plurality of ground lines 108 positioned in each of the plurality of interconnect layers $L_{1-n}$. For example, as shown in FIG. 1, the plurality of vias 112 may electrically connect each of the plurality of voltage lines 106 forming a portion of fifth interconnect layer $L_5$ with each of the plurality of voltage lines 106 forming a portion of sixth interconnect layer $L_6$, such that voltage lines 106 of fifth interconnect layer $L_5$ may pass an electrical current to voltage lines 106 of sixth interconnect layer $L_6$, and vice versa.

Power grid 100 may also include a plurality of fuses 116 formed within each of the plurality of metal lines 102, 104 of each of the plurality of interconnect layers $L_{1-n}$. That is, as shown in FIG. 1, each of the plurality of interconnect layers $L_{1-n}$ may include a plurality of fuses 116 formed within each of the plurality of voltage lines 106 and formed within each of the plurality of ground lines 108. The plurality of fuses 116 of power grid 100 may be positioned substantially adjacent each of the plurality of vias 112, 114 formed within power grid 100. More specifically, as shown in FIGS. 1 and 2, each of the plurality of metal lines 102, 104 may include at least one (e.g., two) of the plurality of fuses 116 positioned between each of the plurality of vias of power grid 100. The plurality of fuses 116 may be configured as any conventional electrical fuse used within a semiconductor structure capable of blowing (e.g., forming an open circuit) to substantially prevent an electrical current from flowing through the plurality of metal lines 102, 104. As discussed herein, at least one (FIGS. 3 and 4) of the plurality of fuses 116 immediately adjacent to defect 111 included in at least one of the plurality of interconnect layers $L_{1-n}$ may be configured to blow during a testing process of semiconductor structure (not shown) including power grid 100 to isolate defect 111.

The number of the plurality of fuses 116 included in power grid 100 may be based upon predetermined semiconductor structure characteristics. That is, a predetermined number of fuses included in the plurality of fuses 116 formed within each of the plurality of metal lines 102, 104 may be based upon or dependent upon predetermined semiconductor structure characteristics. Additionally, a rated current (e.g., max current before blowing) of each of the plurality of fuses 116 formed within each of the plurality of metal lines 102, 104 may be based upon or dependent upon the predetermined semiconductor structure characteristics. The predetermined semiconductor structure characteristics may include, but are not limited to: a desired operational current for at least one component (e.g., transistor) of the semiconductor structure (not shown) electrically connected to power grid 100, the number of the at least one component (e.g., transistor) of the semiconductor structure, the dimensions of power grid 100, predetermined reliability of power grid 100 of the semiconductor structure 100, an end-of-life reliability of power grid 100, or a predetermined acceptable number of inoperable metal lines 102, 104 of the plurality of metal lines 102, 104. The dimensions of power grid 100 may further include: the number of interconnect layers $L_{1-n}$ forming power grid 100, the height of the plurality of interconnect layers $L_{1-n}$ of power grid 100, the width of each of the plurality of interconnect layers $L_{1-n}$ and the size of power grid 100 compared to the entire semiconductor structure (not shown). Additionally, the characteristics of the plurality of fuses 116 may be based upon predetermined semiconductor structure characteristics. That is, characteristics of the plurality of fuses 116 including dimensions of each fuse 116, and a material composition of each fuse 116 may be based upon the predetermined semiconductor structure characteristics as well. It is understood that each of the predetermined semiconductor structure characteristics may be unique to the specific semiconductor structure and its various components that may be provided an electrical current via power grid 100.

Figure 3:
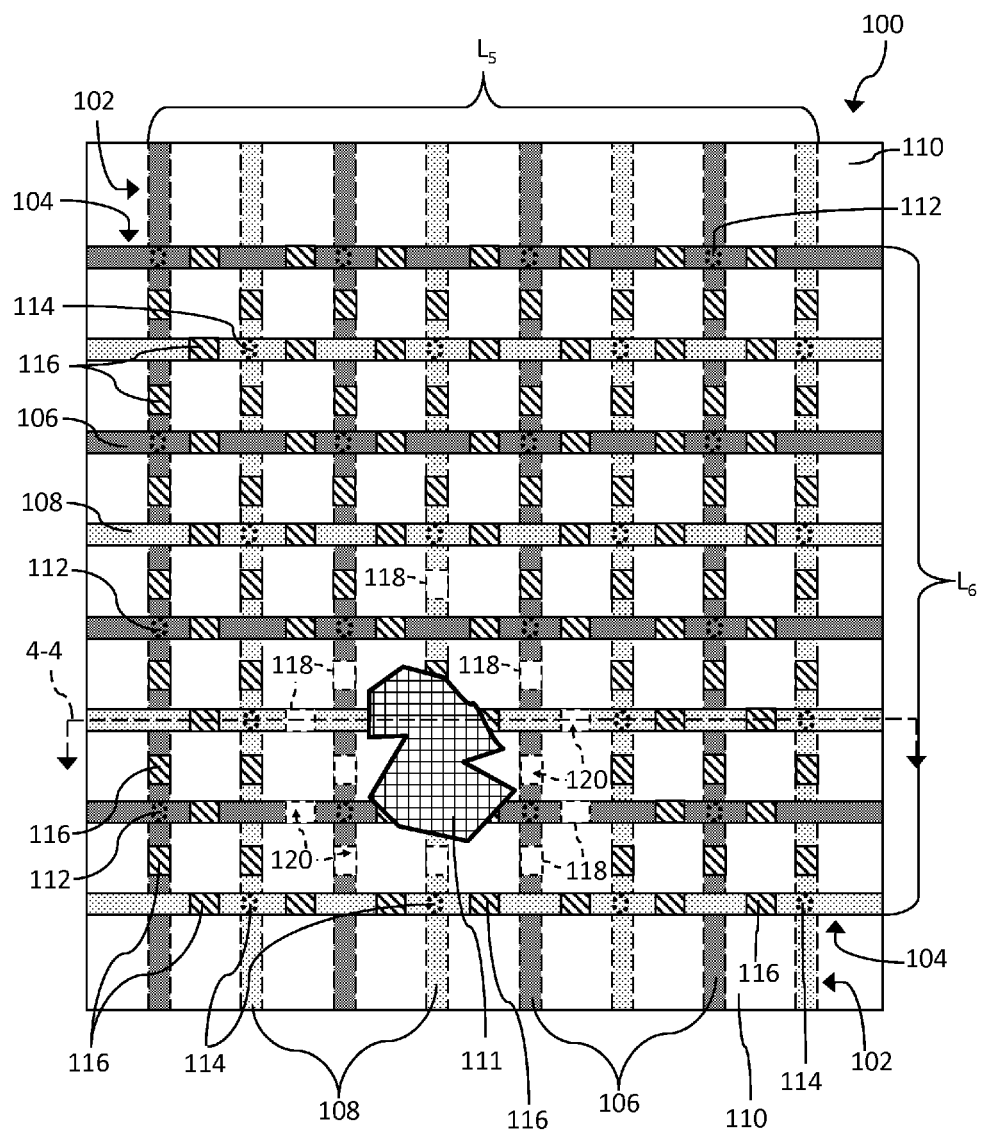
FIG. 3 shows a plane view of a portion of a self-correcting power grid for a semiconductor structure undergoing processes according to various embodiments of the invention.
Figure 4:
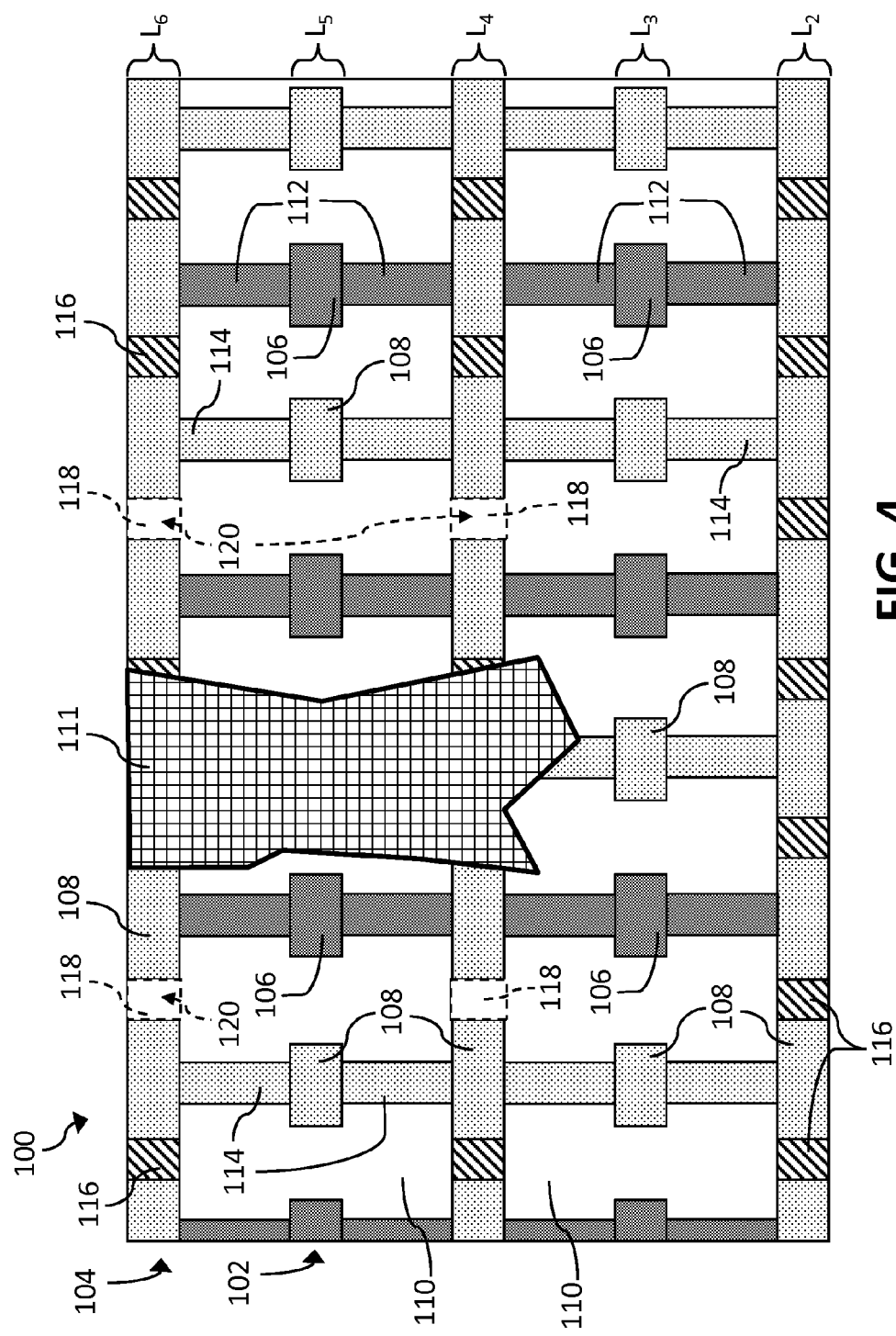
FIG. 4 shows a cross-sectional front view through reference line 4-4 of a portion of a self-correcting power grid for a semiconductor structure as shown in FIG. 3 undergoing processes according to various embodiments of the invention.

FIGS. 3 and 4 depict another process according to various embodiments of the invention, the process including isolating defect 111 in power grid 100 by performing a testing process on a semiconductor structure (not shown) including power grid 100. In the Figures, it is understood that similarly numbered components may represent substantially similar components, which can function in a substantially similar manner. Redundant explanation of these components has been omitted for clarity. As shown in FIGS. 3 and 4, a semiconductor structure (not shown) including power grid 100 may have undergone a testing process, which may result in the isolating of defect 111 included in power grid 100. That is, defect 111 may be substantially isolated within power grid 100 by performing the testing process on the semiconductor structure, which may ultimately blow at least one fuse 118, shown in phantom, of the plurality of fuses 116 positioned immediately adjacent to defect 111. As shown in FIGS. 3 and 4, the at least one blown fuse 118 of the plurality of fuses 116 that may be blown during the testing process in order to isolate defect 111 in power grid 100 may be included in a plurality of interconnect layers $L_{1-n}$. For example, as shown in FIG. 3, the at least one blown fuse 118 of the plurality of fuses 116 that may be blown include fuses positioned on the plurality of metal lines 102 forming fifth interconnect layer $L_5$ and fuses positioned on the plurality of metal lines 104 forming sixth interconnect layer $L_6$. Additionally, as shown in FIG. 4, the at least one blown fuse 118 of the plurality of fuses 116 that may blow may be positioned in fourth interconnect layer $L_4$. The at least one blown fuse 118 of the plurality of fuses 116 may not extend to interconnect layers $L_{1-n}$ which may not include defect 111. For example, as shown in FIG. 4, second interconnect layer $L_2$ may not include any of the at least one blown fuse 118 of the plurality of blown fuses 116, as a result of defect 111 not being positioned through or within second interconnect layer $L_2$. The at least one blown fuse 118 of the plurality of fuses 116 may be blown during the testing process as a result of the undesirable effects defect 111 may cause within power grid 100, as discussed herein. That is, and as discussed herein, when the semiconductor structure is undergoing the testing process, the electrical current passing through the portion of power grid 100 including defect 111 may cause the at least one blown fuse 118 of the plurality of fuses 116 to blow as a result of the undesirable effects (e.g., excess heat, excess current draw) defect 111 may cause within power grid 100. For example, during the testing process, which may provide power grid 100 with an excess voltage as discussed herein, defect 111 may draw the majority of the excess voltage through a portion of sixth interconnect layer $L_6$ of power grid 100. As a result of drawing the excess current to the portion of power grid 100 including defect 111, the at least one blown fuse 118 of the plurality of fuses 116 immediately adjacent to defect 111 may be provided a current substantially above the rated current for each of the plurality of fuses 116 which may cause the at least one blown fuse 118 of the plurality of fuses 116 to blow. As discussed herein, a group of the plurality of fuses 116 positioned adjacent the at least one blown fuse 118 may not be substantially effected by defect 111 of power grid 100, and may be prevented from blowing. The group of the plurality of fuses 116 may not be blown because the excess voltage supplied during the testing process may not cause a current in excess of the rated current in the distinct group of the plurality of fuses unaffected by defect 111.

The performing of the testing process on the semiconductor structure (not shown) including power grid 100 which may blow the at least one blown fuse 118 of the plurality of fuses 116 for isolating defect 111 included in power grid 100 may include performing a stress-test on the semiconductor structure. That is, FIG. 3 may depict power grid 100 after the semiconductor structure including power grid 100 has undergone a stress-test. The stress-test performed on the semiconductor structure including power grid 100 may include heating an ambient temperature of the semiconductor structure including power grid 100 above an operational ambient temperature of the semiconductor structure, and transmitting a test voltage through the semiconductor structure greater than an operational voltage for the semiconductor structure. For example, during the performing of the stress-test on the semiconductor structure including power grid 100 to isolate defect 111, the semiconductor structure may be placed in a testing area which includes an ambient temperature that may be double the ambient temperature that may surround the semiconductor structure during operation. Additionally, during the performing of the stress-test on the semiconductor structure including power grid 100, a test voltage may be transmitted through the semiconductor structure that exceeds the voltage required to power the at least one component (e.g., transistor) of the semiconductor structure during operation.

FIG. 3 depicts an additional process according to various embodiments of the invention, the process including creating an opening 120 in a metal line of the plurality of metal lines 102, 104 including the at least one blown fuse 118 of the plurality of fuses 116. More specifically, as shown in FIG. 3, where the at least one blown fuse 118 of the plurality of fuses 116 are blown as a result of performing the testing process, opening 120 (e.g., gap) may be formed in the respective metal line (e.g., plurality of metal lines 102, 104) to prevent an electrical current from flowing through the respective metal line. As shown in FIG. 3, the plurality of metal lines 102, 104 including the at least one blown fuse 118 of the plurality of fuses 116 that may blow during the testing process may be filled with the material forming dielectric layer 110 to create opening 120 in the plurality of metal lines 102, 104. In forming opening 120 in the plurality of metal lines 102, 104 including defect 111 an electrical current may no longer flow to the portion of power grid 100 including defect 111. As a result of preventing the electrical current from flowing to the portion of power grid 100 including defect 111, defect 111 may not undesirably effect (e.g., excess heat, excess voltage) power grid 100, which may ultimately increase the reliability and operational life of the semiconductor structure including power grid 100.

FIG. 3 depicts an additional process according to various embodiments of the invention, the process including preventing a group of the plurality of fuses from blowing in response to the isolating of defect 111 included in power grid 100. That is, as shown in FIG. 3 and discussed herein, the at least one blown fuse 118 of the plurality of fuses 116 positioned immediately adjacent to defect 111 may blow while performing the testing process, however, a group of the plurality of fuses 116 not including the at least one blown fuse 118 may not blow. The group of the plurality of fuses 116 that may be prevented from blowing (e.g., unblown fuses) during the testing process may substantially surround the at least one blown fuse 118 of the plurality of fuses 116 that may be positioned immediately adjacent defect 111. That is the plurality of fuses 116 positioned immediately adjacent to the at least one blown fuse 118 and/or the plurality of fuses 116 not included in the at least one blown fuse 118 may not be blown during the isolating of defect 111. As a result of preventing the group of the plurality of fuses 116 from blowing in response to isolating defect 111, an electrical current may flow through a portion of all of the plurality of interconnect layers $L_{1-n}$ forming power grid 100 to at least one component (e.g., transistor) of the semiconductor structure (not shown), as discussed herein.

As discussed herein, by utilizing self-correcting power grid 100 in the semiconductor structure including defect 111, undesirable effects (e.g., excess heat, excess voltage) of defect 111 may be substantially minimized or eliminated. In minimizing or eliminating the undesirable effects defect 111 may cause on power grid 100, the reliability and/or operational life of the semiconductor structure may increase. With an increase in reliability and/or operational life of the semiconductor structure, the semiconductor structure including power grid 100 may operate as desired for a longer period of time and/or may not require replacement or maintenance before the semiconductor structure has been used for the duration of its anticipated or desired operational life.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of self-correcting a power grid of a semiconductor structure, the method comprising:
   providing the power grid of the semiconductor structure, the power grid including:
      a plurality of interconnect layers, each of the plurality of interconnect layers including:
         a plurality of metal lines, each of the plurality of metal lines positioned substantially parallel to one another and positioned substantially perpendicular to a plurality of distinct metal lines in an adjacent interconnect layer, and
         a plurality of fuses formed within each of the plurality of metal lines of each of the plurality of interconnect layers; and isolating a defect included in the power grid of the semiconductor structure by performing a testing process on the semiconductor structure including the power grid, the testing process blowing at least one of the plurality of fuses positioned immediately adjacent to the defect and including:
performing a stress-test on the semiconductor structure, the stress test including heating an ambient temperature of the semiconductor structure including the power grid above an operational ambient temperature of the semiconductor structure.

2. The method of claim 1, wherein the performing of the stress-test on the semiconductor structure further comprises:
transmitting a test voltage through the semiconductor structure greater than an operational voltage of the semiconductor structure.

3. The method of claim 1, further comprising preventing a group of the plurality of fuses from blowing in response to the isolating of the defect included in the power grid of the semiconductor structure,
wherein the group of unblown fuses of the plurality of fuses surround the at least one blown fuse of the plurality of fuses positioned immediately adjacent to the defect.

4. The method of claim 1, further comprising creating an opening in a metal line of the plurality of the metal lines including at least one of the blown fuses of the plurality of fuses.

5. The method of claim 1, wherein the defect of the power grid is positioned through at least one of the plurality of metal lines.

6. The method of claim 1, wherein the power grid of the semiconductor structure includes a plurality of vias for electrically connecting each of the plurality of interconnect layers.

7. The method of claim 6, wherein the plurality of fuses of the power grid are positioned substantially adjacent each of the plurality of vias.

8. A method of self-correcting a power grid of a semiconductor structure, the method comprising:
providing the power grid of the semiconductor structure, the power grid including:
a plurality of interconnect layers, each of the plurality of interconnect layers including:
a plurality of metal lines, each of the plurality of metal lines positioned substantially parallel to one another and positioned substantially perpendicular to a plurality of distinct metal lines in an adjacent interconnect layer, and
a plurality of fuses formed within each of the plurality of metal lines of each of the plurality of interconnect layers; and
isolating a defect included in the power grid of the semiconductor structure by performing a testing process on the semiconductor structure including the power grid, the testing process blowing at least one of the plurality of fuses positioned immediately adjacent to the defect,
preventing a group of the plurality of fuses from blowing in response to the isolating of the defect included in the power grid of the semiconductor structure,
wherein the group of unblown fuses of the plurality of fuses surround the at least one blown fuse of the plurality of fuses positioned immediately adjacent to the defect.

9. The method of claim 8, further comprising creating an opening in a metal line of the plurality of the metal lines including at least one of the blown fuses of the plurality of fuses.

10. The method of claim 8, wherein the defect of the power grid is positioned through at least one of the plurality of metal lines.

11. The method of claim 8, wherein the power grid of the semiconductor structure includes a plurality of vias for electrically connecting each of the plurality of interconnect layers.

12. The method of claim 11, wherein the plurality of fuses of the power grid are positioned substantially adjacent each of the plurality of vias.

13. A method of self-correcting a power grid of a semiconductor structure, the method comprising:
providing the power grid of the semiconductor structure, the power grid including:
a plurality of interconnect layers, each of the plurality of interconnect layers including:
a plurality of metal lines, each of the plurality of metal lines positioned substantially parallel to one another and positioned substantially perpendicular to a plurality of distinct metal lines in an adjacent interconnect layer, and
a plurality of fuses formed within each of the plurality of metal lines of each of the plurality of interconnect layers; and
isolating a defect included in the power grid of the semiconductor structure by performing a testing process on the semiconductor structure including the power grid, the testing process blowing at least one of the plurality of fuses positioned immediately adjacent to the defect and including:
performing a stress-test on the semiconductor structure, the stress test including heating an ambient temperature of the semiconductor structure including the power grid above an operational ambient temperature of the semiconductor structure and transmitting a test voltage through the semiconductor structure greater than an operational voltage of the semiconductor structure.

14. The method of claim 13, further comprising creating an opening in a metal line of the plurality of the metal lines including at least one of the blown fuses of the plurality of fuses.

15. The method of claim 13, wherein the defect of the power grid is positioned through at least one of the plurality of metal lines.

16. The method of claim 13, wherein the power grid of the semiconductor structure includes a plurality of vias for electrically connecting each of the plurality of interconnect layers.

17. The method of claim 16, wherein the plurality of fuses of the power grid are positioned substantially adjacent each of the plurality of vias.

\* \* \* \* \*